(12) United States Patent
Furugori et al.

(10) Patent No.: US 7,446,471 B2
(45) Date of Patent: Nov. 4, 2008

(54) OLED PROVIDED WITH ORGANIC LAYER COMPRISING FIRST AND SECOND DOPANTS BASED ON IRIDIUM ORGANIC COMPLEX COMPOUNDS

(75) Inventors: Manabu Furugori, Kanagawa (JP); Shinjiro Okada, Kanagawa (JP); Akira Tsuboyama, Kanagawa (JP); Takao Takiguchi, Tokyo (JP); Seishi Miura, Kanagawa (JP); Takashi Moriyama, Kanagawa (JP); Satoshi Igawa, Kanagawa (JP); Jun Kamatani, Kanagawa (JP); Hironobu Iwawaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/590,827

(22) Filed: Nov. 1, 2006

(65) Prior Publication Data

US 2007/0046177 A1    Mar. 1, 2007

Related U.S. Application Data

(60) Continuation of application No. PCT/JP02/05891, filed on Jun. 13, 2002, and a division of application No. 10/207,843, filed on Jul. 31, 2002, now Pat. No. 6,838,818, and a division of application No. 10/943,868, filed on Sep. 20, 2004, now Pat. No. 7,166,958.

(30) Foreign Application Priority Data

| Jun. 15, 2001 | (JP) | 2001-181416 |
| May 17, 2002 | (JP) | 2002-143441 |
| May 17, 2002 | (JP) | 2002-143442 |
| May 17, 2002 | (JP) | 2002-143443 |

(51) Int. Cl.
*H01L 51/50* (2006.01)
*H01L 51/54* (2006.01)
*H05B 33/14* (2006.01)

(52) U.S. Cl. .............. 313/504; 428/690; 428/917; 313/503; 313/506

(58) Field of Classification Search .............. 428/690, 428/917; 313/503, 504
See application file for complete search history.

(56) References Cited

U.S. PATENT DOCUMENTS 6,097,147 A    8/2000    Baldo et al. .............. 313/506

(Continued)

FOREIGN PATENT DOCUMENTS

EP    879868    11/1998

(Continued)

OTHER PUBLICATIONS

"Recent Development in Molecular Organic Electroluminescent Materials", Chen et al., Macromol. Symp. (1977), 125, pp. 1-48.

(Continued)

*Primary Examiner*—Mariceli Santiago
(74) *Attorney, Agent, or Firm*—Fitzpatrick, Cella, Harper & Scinto (57) ABSTRACT

A light emitting device having an anode and a cathode provided on a substrate, and an organic light emitting layer between the anode and the cathode, where the organic light emitting layer includes a light emitting material and a dopant for improving the dispersability thereof. As the dopant, there are employed a light emitting compound and a non-light emitting compound or a current enhancing material. In case of employing the light emitting compound, the composition corresponds to a case of utilizing plural light emitting materials, and, in such case, the light emission wavelengths are preferably mutually closer. Also, evaporation of the light emitting material and the dopant in the same evaporation boat makes it possible to reduce evaporation temperature, thereby improving the dispersability of the light emitting material.

2 Claims, 2 Drawing Sheets

U.S. PATENT DOCUMENTS

| | | | |
|---|---|---|---|
| 6,310,231 B1 | 10/2001 | Igarashi et al. | 556/489 |
| 6,515,298 B2 | 2/2003 | Forrest et al. | 257/40 |
| 6,555,959 B1 | 4/2003 | Nii | 313/506 |
| 6,696,177 B1 * | 2/2004 | Hatwar | 428/690 |
| 6,734,623 B1 | 5/2004 | Aziz et al. | 313/506 |
| 7,166,958 B2 * | 1/2007 | Furugori et al. | 313/504 |
| 7,294,849 B2 | 11/2007 | Thompson et al. | 257/40 |
| 2003/0218418 A9 * | 11/2003 | Sato et al. | 313/504 |

FOREIGN PATENT DOCUMENTS

| | | |
|---|---|---|
| WO | WO 0108230 | 2/2001 |
| WO | WO 0141512 | 6/2001 |

OTHER PUBLICATIONS

"Improved energy transfer in electrophosphorescent devices", O'Brien et al., Applied Physics Letters (1999), vol. 74, No. 3, pp. 442-444. etoresisit.

"Very high-efficiency green organic light-emitting devices based on electrophosphorescence" Baldo, et al., Applied Physics Letters (1999), vol. 75, No. pp. 4-6.

"High-efficiency fluorescent organic light-emitting devices using a phosphorescent sensitizer", Forrest et al., Letters to Nature (2000), vol. 4, pp. 750,753.

Baldo, et al; "High-efficiency fluorescent . . . phosphorescent sensitizer;" Nature; vol. 403, No. 6771, 750-753 (Feb. 2000).

* cited by examiner

Wavelength (nm)

OLED PROVIDED WITH ORGANIC LAYER COMPRISING FIRST AND SECOND DOPANTS BASED ON IRIDIUM ORGANIC COMPLEX COMPOUNDS

This application is a division of application Ser. No. 10/943,868, filed Sep. 20, 2004, which in turn, is a division of application Ser. No. 10/207,843, filed Jul. 31, 2002, which in turn, is a continuation of International Application No. PCT/JP02/05891, filed Jun. 13, 2002, published as International Publication No. WO/02/104080 A1 on Dec. 27, 2002, in Japanese, but not in English, and which claims the benefit of Japanese Patent Application Nos. 181416/2001, filed Jun. 15, 2001; 143441/2002, filed May 17, 2002; 143442/2002, filed May 17, 2002 and 143443/2002, filed May 17, 2002.

BACKGROUND OF THE INVENTION

1. Field of the Invention

The present invention relates to a light emitting device utilizing an organic compound, and more detailedly to a light emitting device, particularly an organic electroluminescent device (organic EL device), having excellent luminance, efficiency and drive durability by doping a light emitting layer with plural compounds.

2. Related Background Art

Figure 1A:
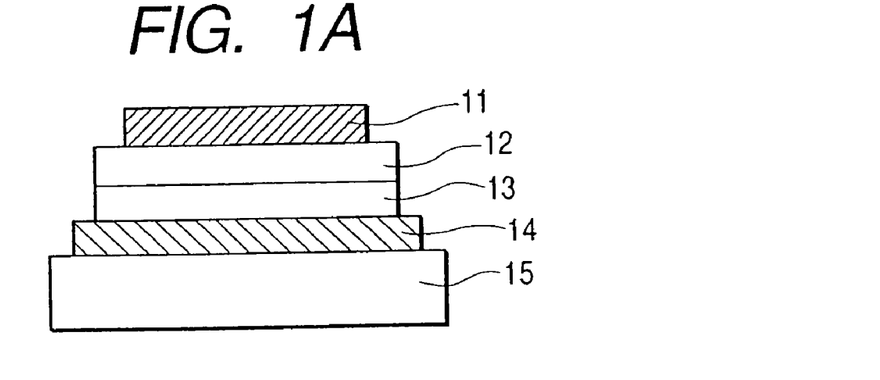
FIG. 1A shows a device configuration with a two-layered organic layer.
Figure 1B:
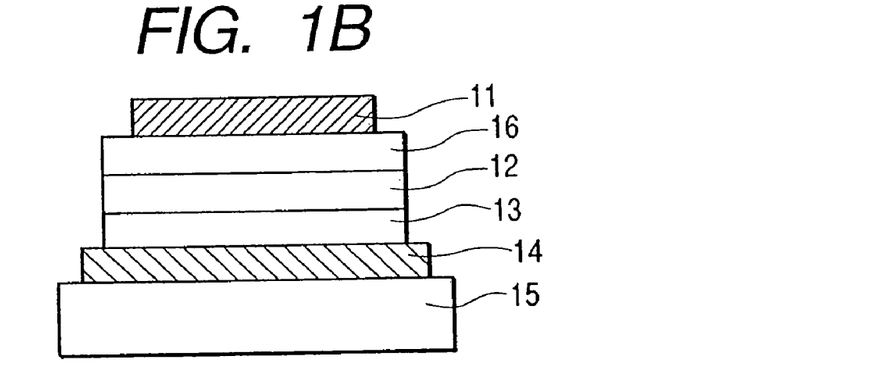
FIG. 1B shows a device configuration with a three-layered organic layer.
Figure 1C:
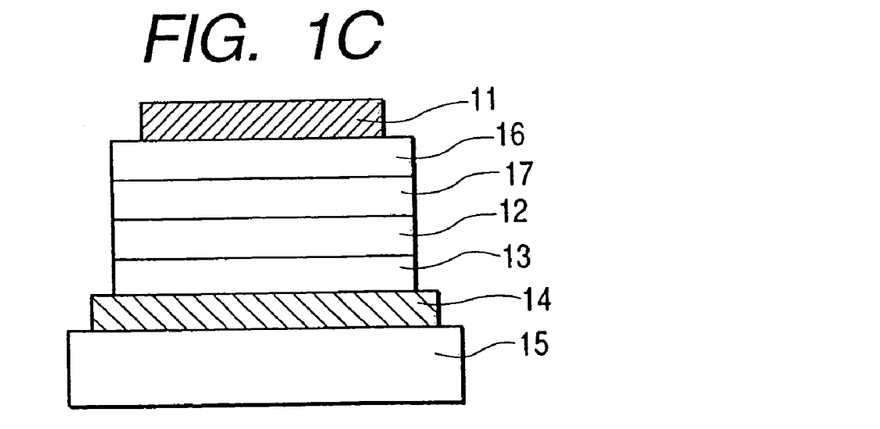
FIG. 1C shows a device configuration with a four-layered organic layer.

The organic EL device is being actively investigated for its applications as a light emitting device capable of showing a high speed response and a high efficiency. The basic configuration of such device is shown in FIGS. 1A, 1B and 1C (for example see. Macromol. Symp., 125, 1-48(1997)).

As shown in FIGS. 1A, 1B and 1C, the organic EL device is generally composed, on a transparent substrate 15, of a transparent electrode 14, a metal electrode 11, and an organic layer sandwiched therebetween and consisting of plural organic films.

In the configuration shown in FIG. 1A, the organic layer consists of a light emitting layer 12 and a hole transport layer 13. The transparent electrode 14 is composed for example of ITO having a large work function, thereby achieving satisfactory hall injection characteristics from the transparent electrode 14 into the hole transport layer 13. The metal electrode 11 is composed of a metallic material of a small work function such as aluminum, magnesium or an alloy thereof for achieving satisfactory electron injection characteristics into the light emitting layer 12. These electrodes have a film thickness of 50 to 200 nm.

In the light emitting layer 12, there is employed for example an aluminum quinolinol complex having electron transporting property and light emitting characteristics (as exemplified by Alq3 shown in the following). Also in the hole transport layer 13, there is employed a material showing electron donating property such as a biphenyl diamine derivative (as exemplified by α-NPD shown in the following).

The device of the above-described configuration shows an electric rectifying property, and, when an electric field is applied in such a manner that the metal electrode 11 becomes a cathode and the transparent electrode 14 becomes an anode, the electrons are injected from the metal electrode 11 into the light emitting layer 12 and the holes are injected from the transparent electrode 14 into the light emitting layer 12 through the hole transport layer 13.

The injected holes and electrons cause recombination in the light emitting layer 12 to generate excitons, thereby generating light emission. In this operation, the hole transport layer 13 serves as an electron blocking layer, whereby the efficiency of recombination is increased at the interface of the light emitting layer 12 and the hole transport layer 13 thereby improving the light emitting efficiency.

In the configuration shown in FIG. 1B, an electron transport layer 16 is provided between the metal electrode 11 and the light emitting layer 12 in FIG. 1A. Such configuration separates the light emission from the transportation of electrons and holes, thereby achieving more efficient carrier blocking and realizing efficient light emission. As the electron transport layer 16, there can be employed, for example, an oxadiazole derivative.

Conventionally, the light emission in the organic EL device is generally based on the fluorescence of molecules of a high emission center in a shift from a singlet exciton state to a base state. On the other hand, there is being investigated a device utilizing phosphorescence through a triplet exciton state, instead of the fluorescence through the singlet exciton state. Representative examples of the references reporting such device are:

1) D. F. O'Brien et al, Improved Energy Transfer In Electrophosphorescent Device, Applied Physics Letters Vol. 74, No. 3, p. 422(1999), and
2) M. A. Baldo et al, Very High-efficiency Green Organic Light-emitting Devices Based On Electrophosphorescence, Applied Physics Letters, Vol. 75, No. 1, p. 4(1999).

In these references, there is principally employed an organic layer of a 4-layered configuration as shown in FIG. 1C, consisting of a hole transport layer 13, a light emitting layer 12, an exciton diffusion preventing layer 17 and an electron transport layer 16 from the anode side. There are employed following carrier transporting materials and phosphorescence emitting materials, which are abbreviated as follows:

Alq3: aluminum-quinolinol complex
α-NPD:N4,N4'-dinaphthalen-1-yl-N4,N4'-dipheny-biphenyl-4,4'-diamine
CBP: 4,4'-N,N'-dicarbazole-biphenyl
BCP: 2,9-dimethyl-4,7-diphenyl-1,10-phenanthroline
PtOEP: platinum-octaethylporphilline complex
Ir(ppy)$_3$: iridium-phenylpyridine complex Alq3

α-NPD

-continued

CBP

BCP

Ir(ppy)₃

Also Forrest et al., Nature, 403, p. 750 discloses an EL device of laminated structure utilizing CBP as a host material of the light emitting layer, and causing triplet-singlet energy transfer from a green light emitting layer based on Ir(ppy))₃ to a red light emitting layer based on DCM (dicyanomethylene).

These configurations are different from that of the present invention in that the co-existing light emitting materials have distant light emitting wavelengths and that the forming method does not involve vacuum evaporation of a mixture, as will be clarified later in the examples.

In the above-described organic EL device utilizing phosphorescent light emission, it is important to inject a larger amount of carriers into the light emitting layer at a lower voltage while maintaining the balance of electrons and positive holes at such lower voltage, in order to achieve a high luminance and a high efficiency.

Among such phosphorescent materials, there are known ones with low charge injecting and charge transporting properties, in which it is difficult to cause a large current at a low voltage.

Also many organic materials are known to form a cluster of plural molecules at the evaporation, and the light emitting layer involving such clusters is considered to show a locally high concentration of the light emitting material, leading to a loss in the light emitting efficiency of the device.

Also the organic materials are known to cause deterioration of the characteristics, for example by crystallization of the same molecules in the light emitting layer.

Because of the above-described background, there is desired a light emitting device capable of providing a high luminance of light emission and a long service life.

SUMMARY OF THE INVENTION

In consideration of the drawbacks in the conventional technologies explained in the foregoing, the object of the present invention is to provide an organic EL device utilizing an organic light emitting material, enabling low-voltage drive and achieving a high luminance, a high efficiency and a high durability.

The above-mentioned object can be attained, according to the present invention, by a light emitting device provided with electrodes consisting of an anode and a cathode formed on a substrate and an organic light emitting layer between such electrodes, the device being featured in that the aforementioned light emitting layer contains a light emitting material and a dopant for improving the dispersibility thereof.

The light emitting device of the present invention is also featured in that the aforementioned dopant is composed of a light emitting compound, and that the light emission spectrum of the aforementioned light emitting material and that of the light emitting compound mutually overlap in a principal portion.

The relationship between the light emission wavelength and the quantum yield of the aforementioned light emitting material and the aforementioned light emitting compound is preferably such that the quantum yield of either having a shorter light emission wavelength is larger than that of the other having a longer light emission wavelength.

At least either of the aforementioned light emitting material and the aforementioned light emitting compound is preferably a metal complex and/or an organic compound, and they preferably have respectively different HOMO levels.

The difference in the peak wavelengths of the light emission spectra of such light emitting material and light emitting compound preferably does not exceed 30 nm.

The aforementioned light emitting material and light emitting compound are preferably composed of plural metal complexes having a same ligand skeletal structure with respectively different substituents in such ligand skeleton, and the central metal of the metal complexes is preferably iridium.

The present invention is also featured by a producing method in which the light emitting material and the light emitting compound are mixed and are subjected to vacuum evaporation in a single heating container.

The light emitting device of the present invention is also featured in that the aforementioned dopant is composed of a non-light emitting compound.

Such non-light emitting compound preferably has a boiling point lower than that of the aforementioned light emitting material.

Also such non-light emitting compound preferably has a band gap larger than that of the light emitting material.

The proportion of the light emitting material and the non-light emitting compound in the organic light emitting layer is preferably changed depending on the position therein. The light emitting material is preferably a phosphorescent light emitting material in terms of the light emitting efficiency.

The light emitting device of the present invention is further featured in that the organic light emitting layer contains a light emitting material and a current enhancing material.

Preferably such current enhancing material is composed of a light emitting material and has a quantum yield lower than that of the aforementioned light emitting material, and the difference of the peak wavelengths in the light emission spectra of these materials preferably does not exceed 30 nm.

The aforementioned current enhancing material has a band gap larger than that of the aforementioned light emitting material.

BRIEF DESCRIPTION OF THE DRAWINGS

FIGS. 1A, 1B and 1C are schematic views showing examples of the configuration of the light emitting device of the present invention, wherein

DESCRIPTION OF THE PREFERRED EMBODIMENTS

The light emitting device of the present invention is provided with an anode, a cathode, and an organic light emitting layer sandwiched between the anode and the cathode. The organic light emitting layer is not particularly limited in configuration, and may assume configurations as shown in FIGS. 1A, 1B and 1C.

The light emitting device of the present invention is featured in that the organic light emitting layer contains a light emitting material and a dopant for improving the dispersibility of the light emitting material, particularly a light emitting compound, or a non-light emitting compound, or a current enhancing material. The aforementioned dopant provides various improvements such as:

(1) increasing the device current even in a device with a light emitting layer in which the carrier injection or carrier movement is difficult, for example a light emitting layer utilizing a phosphorescent light emitting material, thereby achieving a decrease in the drive voltage or a higher light emitting efficiency;

(2) suppressing the crystallization in the light emitting layer, thereby extending the service life of the device;

(3) reducing the evaporation temperature by co-evaporation with the light emitting material; and (4) changing the light emitting position within the light emitting layer, thereby achieving an increase in the luminance etc.

The light emitting device of the present invention is featured, in comparison with a light emitting device having a similar configuration except for the organic light emitting layer, by a larger current or a higher light emission luminance under the application of a similar voltage, or a longer durability in continuous drive, because of a fact that the organic light emitting layer is not constituted by a single light emitting material but is a mixed light emitting layer consisting of a light emitting material and a light emitting compound.

The dopant, in case of a light emitting compound, preferably has a light emission quantum yield lower than that of the principal light emitting material. In this manner the principal light emitting material represents a major portion of the light emission luminance while the contribution of the dopant or the light emitting compound to the light emission luminance can be made smaller.

A second function of the dopant is to stabilize the light emitting material present in the light emitting layer. In such function, the light emitting compound preferably has a molecular structure different from that of the light emitting material and capable of inhibiting the crystallization or dimerization in the base state or the formation of an associate in the excited state. The light emitting material and the light emitting compound are desirably similar in the light emitting property but are different in the molecular structure, for example, in case of metal complexes, having a same basic skeletal structure but being different in the substituents.

A third function of the dopant is to control the molecular flow at the evaporation. The evaporation under heating of a mixture of plural materials of different evaporation temperatures allows to suppress the formation of a cluster such as microcrystals. Such effect can be expected for example by evaporating a fluorinated organic compound together with the light emitting material.

For example following compounds can be conceived as a fluorinated ligand of iridium complex:

In case a light emitting compound is employed as the dopant, it is important to obtain light emission as close as possible to a single color. It is therefore preferred that the light emission spectrum of such light emitting compound overlaps with that of the light emitting material in a principal portion, or that the difference of the peak wavelengths in the light emission spectra of the two does not exceed 30 nm.

For example, in case the light emitting material emits red light and the intensity ratio of the light emission of the light emitting material and the light emitting compound is 10:1, it is confirmed by a simulation that the CIE coordinate value of the emitted light does not change significantly if the difference of the peak wavelengths in the light emission spectra is 30 nm or less. Therefore, from the standpoint of obtaining light emission of a high color saturation, it is preferred that the difference of the peak wavelengths in the light emission spectra of the light emitting material and the light emitting compound does not exceed 30 nm.

In this manner there can be obtained a device showing little change in the color saturation even when light is emitted from both the light emitting material and the light emitting compound. Also, in case an energy transfer is involved from the light emitting compound to the light emitting material, there can be obtained an advantage of facilitating such energy transfer because of the small energy difference.

Also by selecting the band gap of the light emitting compound larger than that of the light emitting material, the recombination of electron and positive hole tends to take place easier on the light emitting material than on the light emitting compound, whereby the light emission can be obtained principally from the light emitting material.

In the present invention, the proportion of the light emitting material and the light emitting compound may be varied depending on the location within the organic light emitting layer, thereby controlling the distribution of the electrons and the positive holes within the light emitting layer, and regulating the position of the electron-positive hole recombination within the light emitting layer. In this manner there can be prepared a device of high efficiency with satisfactory light emission color.

compound employable in the present invention can be, for example, the compound A shown below, CBP or Ir complex A.

The light emitting material can be, for example, Ir complex B, Ir(ppy)$_3$, or Ir complex C.

In the following there are shown the structures of other compounds, in addition to those mentioned in the foregoing:

TAZ compound A

Ir complex A   Ir complex B

Ir complex C

In the present invention, the non-light emitting compound means a compound which is significantly inferior to the aforementioned light emitting compound in the light emitting property and does not emit electroluminescent light singly, thus not contributing to the light emission of the EL device.

The light emitting layer is generally composed of the light emitting material dispersed in a host material having electro-conductivity, but can also be composed of the light emitting material only. The present invention is featured in that a dopant is further added to such materials. The host material can be, for example, CBP or TAZ, and the light emitting

EXAMPLES

At first there will be explained a common part of the device preparation processes employed in the examples 1 and 2.

In these examples, there was employed a device configuration with a four-layered organic layer as shown in FIG. 1C. An ITO film (transparent electrode 14) of a thickness of 100 nm was patterned on a glass substrate (transparent substrate 15). On thus prepared ITO substrate, following organic layers and electrode layers were formed in succession by vacuum evaporation by resistance heating in a vacuum chamber of $10^{-4}$ Pa:

hole transport layer 13 (40 nm): α-NPD
light emitting layer 12 (40 nm): host material+light emitting material+light emitting compound
exciton diffusion preventing layer 17 (10 nm): BCP
electron transport layer 16 (30 nm): Alq3
metal electrode layer 1 (15 nm): AlLi alloy (Li content 1.8 wt. %)
metal electrode layer 2 (100 nm): Al These layers were so patterned that the electrodes have an opposed area of 3 mm².

Example 1

A device was prepared by employing CBP as the host material of a light emitting layer and doping the light emitting layer with the Ir complex C as the light emitting material at a concentration of 7 wt. % and with the Ir complex A as the light emitting compound at a concentration of 3 wt. %. The employed Ir complex A has a function of increasing the current in the device, thus also serving as the current enhancing material.

Comparative Example 11

A device was prepared as in the example 1, except that the doping with the Ir complex A as the light emitting compound was not executed.

Table 1 shows the results of measurement of current and luminance of these devices under the application of a DC voltage of 10 V.

TABLE 1

|  | Current (mA/cm²) | Luminance (cd/m²) |
|---|---|---|
| Example 1 | 80.2 | 806 |
| Comp. Ex. 11 | 11.8 | 426 |

The example 1, utilizing the Ir complex A as the light emitting compound, showed increases in the current and in the luminance. Also the current enhancing effect of the Ir complex A could be confirmed from a significant increase in the device current.

The light emission spectrum shows not only the light emission from the Ir complex C but also from the Ir complex A. The Ir complex C has a light emission spectrum having a peak at 620 nm, while the Ir complex A has a light emission spectrum having a peak at 610 nm. Since the difference of the peak wavelengths in the light emission spectra did not exceed 30 nm, the value on the CIE coordinates did not show any significant change.

The complex A had a quantum yield of 0.3 while the Ir complex C had a quantum yield of 0.66. The quantum yield was determined in the following manner:

$\Phi(sample)/\Phi(st)=[Sem(sample)/Iabs(sample)]/[Sem(st)/Iabs(st)]$ $\Phi(sample)$: quantum yield of measured sample
$\Phi(st)$: quantum yield of standard substance
Iabs(st): absorption coefficient at excitation wavelength of standard substance
Sem(st): area intensity of light emission spectrum of standard substance when excited at the same wavelength
Iabs(sample): absorption coefficient at excitation wavelength of measured sample
Sem(sample): area intensity of light emission spectrum of the measured sample when excited at the same wavelength.

The quantum yield Φ mentioned herein is represented by a relative value, taking Φ of the Ir complex G (to be explained later) as unity. Also Iabs was measured with a UV spectrophotometer (Shimadzu Mfg. Co.: UV3100), and Sem was measured with a fluorescent spectrophotometer (Hitachi Co.: F4500).

Example 2

A device was prepared by employing CBP as the host material of the light emitting layer, and doping the region of a thickness of 10 nm at the side of the hole transport layer within the light emitting layer of a thickness of 40 nm, with the Ir complex C as the light emitting material at a concentration of 7 wt. % and with the Ir complex A as the light emitting compound at a concentration of 3 wt. %, while co-evaporating the Ir complex C alone at a concentration of 7 wt. % in the remaining 30 nm region. The employed Ir complex A has a function of increasing the current in the device, thus also serving as the current enhancing material.

Table 2 shows the results of measurement of current and luminance of the above-described device and the device of the comparative example 11 under the application of a DC voltage of 10 V.

TABLE 2

|  | Current (mA/cm²) | Luminance (cd/m²) |
|---|---|---|
| Example 2 | 23.5 | 621 |
| Comp. Ex. 11 | 11.8 | 426 |

The results in Table 2 confirm that the device of the example 2 showed an increase in the current and the luminance in comparison with the device of the comparative example 11, and that the light emitting compound, even in case of doping only a part of the light emitting layer, has an effect of increasing the current and the luminance. Following Tab. 3 shows the quantum yield and band gap of the Ir complex A and the Ir complex C. The Ir complex A has a larger band gap and a smaller quantum yield.

TABLE 3

|  | Quantum yield | Band gap |
|---|---|---|
| Ir complex A | 0.3 | 2.02 eV |
| Ir complex C | 0.66 | 2 eV |

In the comparison of the examples 1 and 2, the light emission spectrum of the example 2 showed a weaker light emission from the Ir complex A and a higher proportion of the light emission from the Ir complex C in comparison with the example 1. This is because the injection of positive holes became easier by the current enhancing effect, whereby the electron-positive hole recombination and the light emission principally took place in the Ir complex C.

Example 3

In this example, there was employed a device configuration with a four-layered organic layer as shown in FIG. 1C. An ITO film (transparent electrode 14) of a thickness of 100 nm was patterned on a glass substrate (transparent substrate 15). On thus prepared ITO substrate, following organic layers and electrode layers were formed in succession by vacuum evaporation by resistance heating in a vacuum chamber of $10^{-4}$ Pa:

Hole transport layer 13 (40 nm): FL03 (following chemical formula)

Light emitting layer 12 (40 nm): host material+light emitting material 1+light emitting material 2 Electron transport layer 17 (50 nm): Bphen (following chemical formula)

Electron injection layer 16 (1 nm): KF
Metal electrode layer (100 nm): Al

It was so patterned that the electrodes had an. opposed area of 3 $mm^2$.

In forming the light emitting layer 12, the Ir complex C was employed as the light emitting material 1, and the Ir complex D was employed as the light emitting material 2.

(Ir complex D)

The Ir complex C and the Ir complex D were measured in equal amounts and were agitated and mixed under crushing of the crystals in an agate mortar to obtain powder mixture.

Thus obtained powder mixture was charged in an evaporation boat and was subjected to co-evaporation with CBP as the host material. The co-evaporation with the host material was conducted in such a manner that the aforementioned mixture of the Ir complex C and the Ir complex D represented 7 wt. %.

The characteristics of thus prepared device are shown in the following table.

Comparative Example 31

A device was prepared utilizing only the Ir complex C of the light emitting material 1 as the light emitting material.

Comparative Example 32

A device was prepared utilizing only the Ir complex D of the light emitting material 2 as the light emitting material.
The results of evaluation of these devices are also shown in the following table.

TABLE 4

| | | Characteristics at luminance 100 $cd/m^2$ | | | Luminance |
|---|---|---|---|---|---|
| | Light emitting material | voltage (v) | current efficiency (cd/A) | power efficiency (lm/W) | half-life (hr) from initial value 1000 $cd/m^2$ |
| Example 3 | Ir complex C + Ir complex D | 5.7 | 13.5 | 7.6 | 52 |
| Comp. Ex. 31 | Ir complex C | 5 | 7.6 | 4.8 | 50 |
| Comp. Ex. 32 | Ir complex D | 7.5 | 6.8 | 2.9 | 5.4 |

In the device of the present example, the drive voltage required for light emission at 100 $cd/m^2$ was 5.7 V, which was somewhat higher than 5 V in the comparative example 31 but was significantly lower than 7.5 V in the comparative example 32.

Also the current efficiency (measured in cd/A) was 13.5 cd/A, which was significantly higher than 7.6 cd/A in the comparative example 31 and 6.8 cd/A in the comparative example 32.

The situation was similar also in the power efficiency, and the device of the present example was very efficient with a power efficiency of 7.61 m/W which is significantly higher than 4.81 m/W in the comparative example 31 and 2.91 m/W in the comparative example 32.

Furthermore, the half life of the luminance in the continuous drive of the device from an initial luminance of 1000 $cd/m^2$ was 52 hours, corresponding to a significant improvement in comparison with 50 hours in the comparative example 31 and 5.4 hours in the comparative example 32. The half life of the luminance attained an improvement of more than 10 times in comparison with the comparative example 32, and is considered to represent a particularly large effect of the present invention.

In the present example, the Ir complex C has a quantum yield of 0.66 while the Ir complex D has a quantum yield of 0.92. The peak wavelength of light emission is 620 nm in the Ir complex C and 595 nm in the Ir complex D.

However, in case of employing an Ir complex I having a peak wavelength of light emission of 595 nm same as in the Ir complex D but having a lower quantum yield of 0.29, the light emission efficiency at the luminance of 300 cd/m² and the half life were inferior to those in the device employing the Ir complex D. It is therefore found desirable that the quantum yield of the light emitting material having a shorter wavelength of light emission is larger than that of the light emitting material having a longer wavelength of light emission.

TABLE 5

| Light emitting material | Efficiency (300 cd/m²) cd/A | Half life (hours) |
|---|---|---|
| Ir complex C + Ir complex D | 11.1 | 93 |
| Ir complex C + Ir complex I | 8.3 | 18.2 |

Ir complex I

In the iridium complexes employed in the present example, the levels of the highest occupied molecular orbit (HOMO) and of the lowest unoccupied molecular orbit (LUMO) were as follows.

TABLE 6

|  | Ir complex C | Ir complex D |
|---|---|---|
| HOMO (eV) | −5.13 | −5.32 |
| LUMO (eV) | −2.47 | −2.6 |

Both the HOMO level and the LUMO level were higher in the iridium complex C than in the iridium complex D.

The electron levels were determined, based on the measurement of oxidation-reduction potential by cyclic voltammetry (model: Electrochemical Interface SI 1287, Solartron Inc.) and the data of band gap measurement by optical absorption, by conversion with reference to the separately measured HOMO of the Ir complex C (model: AC-1, Riken Kiki Co.).

Figure 2:
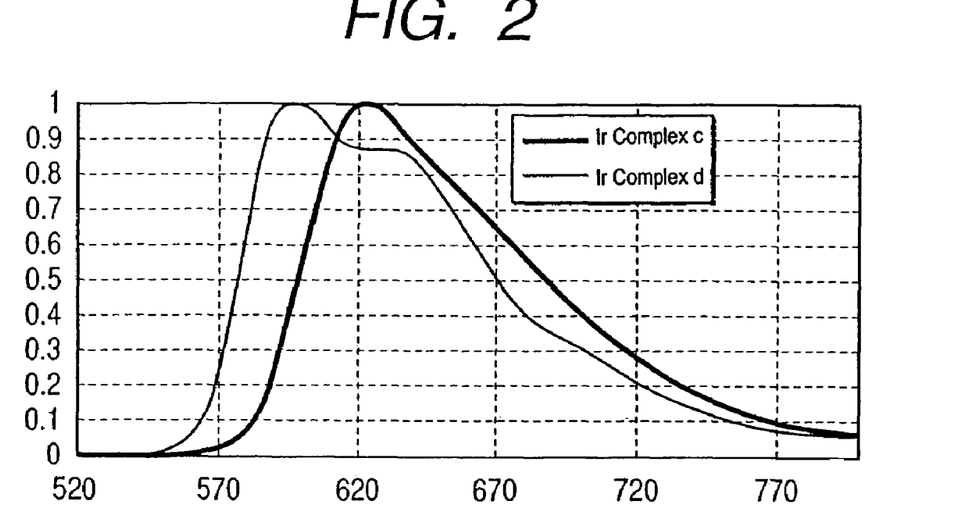
FIG. 2 is a chart showing light emission spectra of the light emitting material and the light emitting compound employed in the present invention, with the abscissa representing wavelength and the ordinate representing normalized intensity of light emission, illustrating an example of an Ir complex C and an Ir complex D and showing a fact that the light emission spectra mutually overlap in a principal portion.

Then, FIG. 2 shows the photoluminescence (optically excited light emission spectra in dilute toluene solution) of the Ir complex C and the Ir complex D employed in the present example. The light emission spectra of these two compounds are mutually very close and mutually overlap in the principal portion of the spectra. The shift in color is not conspicuous because of the use of the light emitting materials having very close light emission wavelengths.

The Ir complex C and the Ir complex D, employed in the present example, have the evaporation temperature in vacuum of 267° C. and 234° C. respectively, and, in general, the evaporation temperature is lower in the iridium complex including fluorine atoms. One of the features of the present invention lies in a fact that the molecular flow in the evaporation process can be controlled (for example control of cluster size) by evaporating a mixture of light emitting materials of different evaporation temperatures from a same crucible.

Also the electric current supplied to the heating container, required for evaporation of the present example, was lower in the mixture, indicating a less thermal impact at the evaporation. These results are shown in the following table.

TABLE 7

| Light emitting material | Efficiency (cd/A) | Boat current (Amp) |
|---|---|---|
| Ir complex C | 6.5 | 56.1 |
| Ir complex C + Ir complex D | 12.8 | 53.7 |

Comparative Example 33

Following table shows comparison with a case of evaporating the Ir complex C and the Ir complex D from different boats.

TABLE 8

|  | Evaporation of light emitting material | Characteristics at luminance 100 cd/m² | | |
|---|---|---|---|---|
|  |  | Voltage (V) | Current efficiency (cd/A) | Power efficiency (lm/W) |
| Example 3 | same boat | 5.7 | 13.5 | 7.6 |
| Comp. ex. 33 | different boats | 5.5 | 9.6 | 5.8 |
| Comp. ex. 31 | Ir complex C only | 5 | 7.6 | 4.8 |

In comparison with the case of evaporating the Ir complex C only, the current efficiency and the power efficiency were improved even in case of forming the mixed light emitting layer with the Ir complex D by evaporation from different boats. On the other hand, in the present example 3, in which the two complexes are mixed and evaporated from a same boat, the current efficiency and the power efficiency were improved in comparison with the comparative examples 31 and 33. This is presumably ascribable to a fact that the temperature at evaporation was lowered by the use of a mixture, thereby reducing the evaporation temperature and improving the film quality.

Comparative Example 34

As a next comparative example, a device was prepared by mixing and evaporating an Ir complex G (next structural formula) and the Ir complex C.

(Ir complex G)

Figure 3:
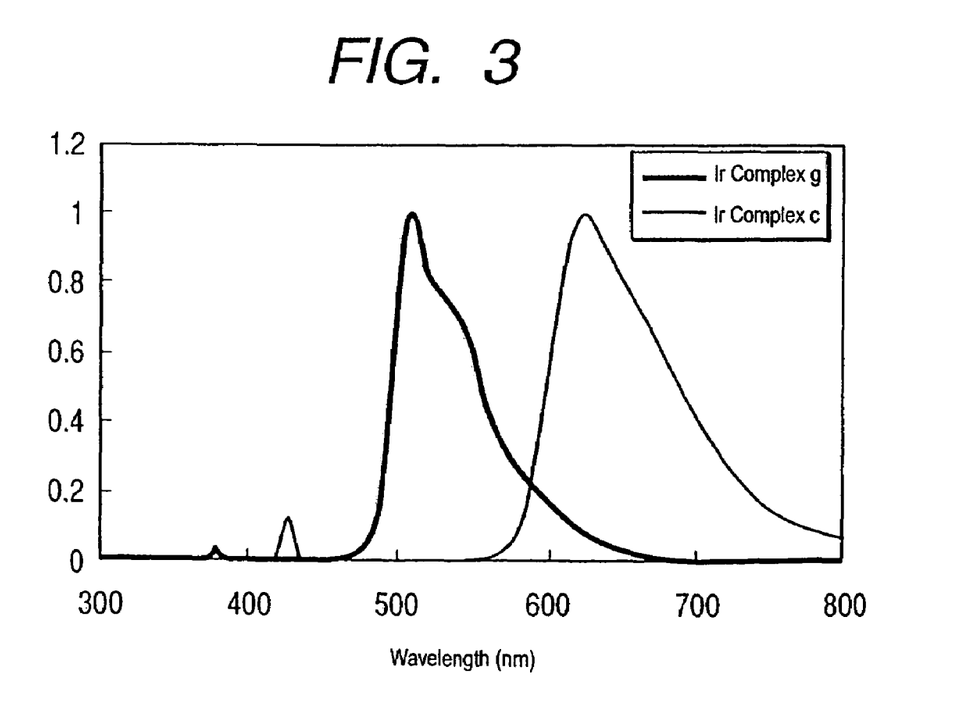
FIG. 3 is a chart showing light emission spectra of a reference example, indicating that the light emission spectra mutually overlap less and have mutually distant peak wavelengths.

The Ir complex G has a light emission peak at 514 nm, while the Ir complex C has a light emission peak at 620 nm, so that the light emission spectra show little overlapping as shown in FIG. 3. In the present comparative example, the current efficiency and the power efficiency are inferior to those of the example 3. This fact indicates that the device characteristics can be improved if the overlapping portion of the light emission wavelength of each light emitting material is larger than the non-overlapping portion.

TABLE 9

| | Light emitting material | Voltage (V) | Characteristics at luminance 100 cd/m² | |
|---|---|---|---|---|
| | | | Current efficiency (cd/A) | Power efficiency (lm/W) |
| Comp. ex. 34 | Ir complex C + Ir complex G | 6.3 | 10.5 | 5.4 |
| Example 3 | Ir complex C + Ir complex D | 5.7 | 13.5 | 7.6 |

Example 4

In this example, there was employed a device configuration with a four-layered organic layer as shown in FIG. 1C. An ITO film (transparent electrode 14) of a thickness of 100 nm was patterned on a glass substrate (transparent substrate 15).

On thus prepared ITO substrate, following organic layers and electrode layers were formed in succession by vacuum evaporation by resistance heating in a vacuum chamber of 10⁻⁴ Pa. In the light emitting layer, there were used plural light emitting materials:

Hole transport layer 13 (40 nm): FL03
Light emitting layer 12 (40 nm): host material+light emitting material 1+light emitting material 2+light emitting material 3+light emitting material 4.
Electron transport layer 17 (50 nm): Bphen
Electron injection layer 16 (1 nm): KF
Metal electrode layer (100 nm): Al

It was so patterned that the electrodes had an opposed area of 3 mm².

In the present example, the Ir complex C was employed as the light emitting material 1, and the Ir complex D was employed as the light emitting material 2. An Ir complex E (following structural formula) was employed as the light emitting material 3:

(Ir complex E)

Also an Ir complex F (following structural formula) was employed as the light emitting material 4:

(Ir complex F)

The Ir complexes C, D, E and F were mixed in a ratio of 3:1:2.5:3.5 to obtain a powder mixture. Thus obtained powder mixture was charged in an evaporation boat and co-evaporated with CBP as the host material. The film formation was so executed that the above-mentioned Ir complex mixture represented 7 wt. % of the host material. The characteristics of thus prepared device are shown in the following table 10, together with the evaluation results thereof.

TABLE 10

| | Light emitting material | Characteristics at luminance 100 cd/m² | | | Luminance half life |
|---|---|---|---|---|---|
| | | Voltage (V) | Current efficiency (cd/A) | Power efficiency (lm/W) | (hr) at initial luminance 1000 cd/m² |
| Example 4 | Ir complexes C, D, E, F | 4.2 | 11.7 | 8 | 116 |
| Comp. ex. 31 | Ir complex C | 5 | 7.6 | 4.8 | 50 |
| Comp. ex. 32 | Ir complex D | 7.5 | 6.8 | 2.9 | 5.4 |

In the device of the present example, the drive voltage required for light emission at 100 cd/m² was 4.2 V, which corresponds to a significant improvement in comparison with 5 V in the comparative example 31 and 7.5 V in the comparative example 32. Also the current efficiency (measured in cd/A) was 11.7 cd/A, which was significantly higher than 7.6 cd/A in the comparative example 31 and 6.8 cd/A in the comparative example 32. The situation was similar also in the power efficiency, whereby a highly efficient device could be obtained.

Furthermore, the half life of the luminance in the continuous drive of the device from an initial luminance of 1000 cd/m² was 116 hours, corresponding to a significant improvement in comparison with 50 hours in the comparative example 31 and 5.4 hours in the comparative example 32. The half life of the luminance attained an improvement of from 2 to over 20 times in comparison with the comparative example, and is considered to represent a particularly large effect of the present invention.

Also the electric current supplied to the evaporation boat of the present example was lower in the mixture, indicating a lower temperature at the film formation of the light emitting layer and a less thermal damage. These results are shown in the following table.

TABLE 11

| Light emitting material | Boat current (Amp) |
|---|---|
| Ir complex C | 56.1 |
| Ir complexes C, D, E, F | 55.7 |

Example 5

In this example, there was employed a device configuration with a three-layered organic layer as shown in FIG. 1B. An ITO film (transparent electrode 14) of a thickness of 100 nm was patterned on a glass substrate (transparent substrate 15).

On thus prepared ITO substrate, following organic and electrode layers were formed in succession by vacuum evaporation by resistance heating in a vacuum chamber of $10^{-4}$ Pa:
Hole transport layer 13 (40 nm): FL03
Light emitting layer 12 (40 nm): host material+light emitting material 1+light emitting material 2
Electron transport layer 17 (50 nm): Bphen
Metal electrode layer (100 nm): Al It was so patterned that the electrodes had an opposed area of 3 mm².

In the present example, a compound C (abbreviated as DCM) was employed as the light emitting material 1.

(Compound C)

As the light emitting material 1, there may also be employed a compound D represented by the following structural formula:

(Compound D)

The light emitting material 2 was composed of the aforementioned Ir complex C.

The compound C and the Ir complex C were measured in equal amounts and were agitated and mixed under crushing of the crystals in an a gate mortar to obtain powder mixture. Thus obtained powder mixture was charged in an evaporation boat and was subjected to co-evaporation with CBP as the host material.

The co-evaporation with the host material was conducted in such a manner that the aforementioned mixture of the compound C and the Ir complex C represented 7 wt. %.

Example 6

In this example, there was employed a device configuration with a three-layered organic layer as shown in FIG. 1B. An ITO film (transparent electrode 14) of a thickness of 100 nm was patterned on a glass substrate (transparent substrate 15).

On thus prepared ITO substrate, following organic and electrode layers were formed in succession by vacuum evaporation by resistance heating in a vacuum chamber of $10^{-4}$ Pa:
Hole transport layer 13 (40 nm): FL03
Light emitting layer 12 (40 nm): host material+light emitting material 1+light emitting material 2
Electron transport layer 17 (50 nm): Bphen
Electron transport/injection layer 16 (1 nm): KF
Metal electrode layer (100 nm): Al It was so patterned that the electrodes had an opposed area of 3 mm².

In the present example, the Ir complex C was employed as the light emitting material 1, and an Ir complex H (following structural formula) was employed as the light emitting material 2:

(Ir complex H)

The Ir complex C and the Ir complex H were measured in equal amounts and were agitated and mixed under crushing of the crystals in an agate mortar to obtain powder mixture. Thus obtained powder mixture was charged in an evaporation boat and was subjected to co-evaporation with CBP as the host material.

The co-evaporation with the host material was conducted in such a manner that the aforementioned mixture of the Ir complexes represented 7 wt. %.

Comparative Example 61

A device was prepared utilizing the Ir complex C only as the light emitting material, and executing co-evaporation with the host material in such a manner that the light emitting material represented 7 wt. %.

Comparative Example 62

A device was prepared utilizing the Ir complex H only as the light emitting material, and executing co-evaporation with the host material in such a manner that the light emitting material represented 7 wt. %.

The results of evaluation of these devices are shown in the following table.

TABLE 12

| | Light emitting material | Characteristics at luminance 100 cd/m² | | | Luminance half life |
| | | Voltage (V) | Current efficiency (cd/A) | Power efficiency (lm/W) | (hr) at initial luminance 1000 cd/m² |
|---|---|---|---|---|---|
| Example 6 | Ir complex C + Ir complex H | 5.7 | 10.5 | 5.9 | 80 |
| Comp. ex. 61 | Ir complex C | 5 | 7.6 | 4.8 | 50 |
| Comp. ex. 62 | Ir complex H | 5.8 | 16.2 | 8.8 | 1.5 |

In the device of the present example, the drive voltage required for light emission at 100 cd/m² was 5.7 V, which was somewhat higher than 5 V in the comparative example 61 but was significantly lower than 5.8 V in the comparative example 62. Also the current efficiency was 10.5 cd/A, which corresponds to a significant improvement in comparison with 7.6 cd/A in the comparative example 61. The situation was similar also in the power efficiency, and the device of the present example was very efficient with a power efficiency of 5.91 m/W in comparison with 4.81 m/W in the comparative example 61.

Furthermore, the half life of the luminance in the continuous drive of the device from an initial luminance of 1000 cd/m² was 80 hours, corresponding to a significant improvement in comparison with 50 hours in the comparative example 61 and 1.5 hours in the comparative example 62.

The present example was inferior to the comparative example 62 in the current efficiency and the power efficiency, but was improved in the light emission color toward red in comparison with the comparative example 62. More specifically, the present example had CIE coordinate values of (0.68, 0.33) in comparison with the values (0.65, 0.35) of the comparative example 62. The values of light emission of the comparative example 61 were (0.68, 0.33) and were almost same as those of the present example. The half life of the luminance attained an improvement of more than 10 times in comparison with the comparative example 62, and is considered to represent a particularly large effect of the present invention.

In the iridium complexes employed in the present example, and the HOMO level of the Ir complex C was −5.13 eV and was higher than the HOMO level of −5.19 eV of the Ir complex H.

On the other hand, the LUMO level of the Ir complex C was −2.47 eV and was higher than the LUMO level of −2.6 eV of the Ir complex H.

The Ir complex C and the Ir complex H, employed in the present example, have the evaporation temperature in vacuum of 267° C. and 230° C. respectively, and, in general, the evaporation temperature is lower in the iridium complex including fluorine atoms. One of the features of the present invention lies in a fact that the evaporation temperature can be lowered and the cluster size can be made smaller at the evaporation by evaporating a mixture of light emitting materials of different evaporation temperatures from a same crucible.

Also the electric current supplied to the evaporation boat was lower in the mixture, indicating a less thermal deterioration at the device preparation.

These results are shown in the following table.

TABLE 13

| Light emitting material | Efficiency (cd/A) | Boat current (Amp) |
|---|---|---|
| Ir complex C | 6.5 | 56.1 |
| Ir complex C + Ir complex H | 10 | 52.6 |

Example 7

In this example, there was employed a device configuration with a four-layered organic layer as shown in FIG. 1C, with conditions described in the example 1.

A device was prepared by employing CBP as the host material and doping the light emitting layer with the Ir complex B as the light emitting material at a concentration of 7 wt. % and with the compound A as the non-light emitting compound at a concentration of 3 wt. %. The employed compound A has a function of increasing the current in the device, thus also serving as the current enhancing material.

Comparative Example 71

A device was prepared as in the example 7, except that the doping with the compound A was not executed.

Following table shows the results of measurement of current and luminance of these devices under the application of a DC voltage of 10 V.

TABLE 14

| | Current (mA/cm²) | Luminance (cd/m²) |
|---|---|---|
| Example 7 | 50.1 | 386 |
| Comp. Ex. 71 | 36.3 | 312 |

Table 14 indicates that the device of the example 7 showed increases in the current and in the luminance in comparison with that of the comparative example 71, thus confirming the effect of addition of the non-light emitting compound and the effect as the current enhancing material thereof. The light emission spectrum was almost same for the example 7 and the comparative example 71, and the light emission was observed only from the Ir complex B.

Example 8

A device was prepared by employing TAZ as the host material and doping the light emitting layer with CBP as the non-light emitting compound at a concentration of 10 wt. % and with the Ir complex B as the light emitting material at a concentration of 7 wt. %. The employed CBP has a function of increasing the current in the device, thus also serving as the current enhancing material.

Comparative Example 81

A device was prepared as in the example 8, except that the doping with CBP was not executed.

Following table shows the results of measurement of current and luminance of these devices under the application of a DC voltage of 10 V.

TABLE 15

| | Current (mA/cm$^2$) | Luminance (cd/m$^2$) |
|---|---|---|
| Example 8 | 6.56 | 140 |
| Comp. Ex. 81 | 3.18 | 99.4 |

Table 15 indicates that the device of the example 8 showed increases in the current and in the luminance in comparison with that of the comparative example 81, thus confirming the effect of addition of the non-light emitting compound and the effect as the current enhancing material thereof. The light emission spectrum was almost same for the example 8 and the comparative example 81, and the light emission was observed only from the Ir complex B.

CBP has a band gap of 2.5 to 3.0 eV, which is larger than that of 2 eV of the Ir complex B.

Example 9

There was prepared a device similar to that of the example 3 except for the configuration of the light emitting layer. The light emitting layer was composed of a mixture of a host material, a light emitting material and a non-light emitting compound.

In the present example, the Ir complex C including phenyl-isoquinoline as the ligand was employed as the light emitting material, and a compound 3 (following structural formula) was employed as the non-light emitting compound:

(Compound 3)

The Ir complex C and the compound 3 were measured in equal amounts and were agitated and mixed under crushing of the crystals in an agate mortar to obtain powder mixture. Thus obtained powder mixture was charged in an evaporation boat and was subjected to co-evaporation with CBP as the host material which was charged in another evaporation boat. The co-evaporation of the mixture of the Ir complex C with the host material was conducted in such a manner that the aforementioned mixture of the compound C represented 20 wt. %.

The electric current supplied to the heating container at the evaporation of the mixture of the present example was found to be lower, whereby the evaporation temperature could be significantly reduced. This fact alleviated the thermal damage at the preparation of the device, thereby enabling stable preparation of the device.

The HOMO and LUMO levels of the iridium complex and the compound 3 employed in the present example are shown in the following table.

TABLE 16

| | Ir complex C | Compound 3 |
|---|---|---|
| HOMO | −5.13 | −5.38 |
| LUMO | −2.47 | −1.94 |
| Band gap | 2.66 | 3.44 |

It will be understood that the Ir complex C constituting the light emitting material has a band gap narrower than that of the non-light emitting compound 3.

Example 10

There was prepared a device similar to that of the example 3 except for the configuration of the light emitting layer. The light emitting layer was composed of a mixture of a host material, a light emitting material and a non-light emitting compound.

In the present example, the compound C was employed as the light emitting material, and the aforementioned compound 3 was employed as the non-light emitting compound.

The compound C and the compound 3 were measured in equal amounts and were agitated and mixed under crushing of the crystals in an agate mortar to obtain powder mixture. Thus obtained powder mixture was charged in an evaporation boat and was subjected to co-evaporation with CBP as the host material. The co-evaporation was conducted in such a manner that the mixture of the compound C and the compound 3 represented 7 wt. %.

Example 11

Comparative Example 71

In this example, there was employed a device configuration with a four-layered organic layer as shown in FIG. 1C, and the conditions described in the example 1 were employed for the device configuration other than the light-emitting layer.

A device was prepared by employing CBP as the host material and doping the light emitting layer with the Ir complex B as the light emitting material at a concentration of 7 wt. % and with PBD represented by the following structural formula as the current enhancing material at a concentration of 3 wt. %.

Also a device was prepared as in the example 11, except that the doping with PBD was not executed (comparative example 71).

(Structural formula of PBD)

Following table shows the results of measurement of current and luminance of these devices under the application of a DC voltage of 10 V.

TABLE 17

| | Current (mA/cm$^2$) | Luminance (cd/m$^2$) |
|---|---|---|
| Example 11 | 62 | 450 |
| Comp. Ex. 71 | 36.3 | 312 |

Table 17 indicates that the device of the example 11 showed increases in the current and in the luminance in comparison with that of the comparative example 71, thus confirming the effect of the current enhancing material. The light emission spectrum was almost same for the example 11 and the comparative example 71, and the light emission was observed only from the Ir complex B.

In this case, the host material CBP has a strong hole transporting property, and doping with an electron transporting material such as PBD is effective for increasing the device current.

As the current enhancing material employable in the present invention, there may also be employed, for example, an electron transporting material such as PySPy represented by the following structural formula, but such example is not restrictive.

(Structural formula of PySPy)

Example 12

Comparative Example 81

In this example, there was employed a device configuration with a four-layered organic layer as shown in FIG. 1C, and the conditions described in the example 1 were adopted in the device configuration other than the light emitting layer.

A device was prepared by employing TAZ as the host material and doping the light emitting layer with the Ir complex B as the light emitting material at a concentration of 7 wt. % and with NPD represented by the following structural formula as the current enhancing material at a concentration of 3 wt. %.

Also a device was prepared as in the example 12, except that the doping with NPD was not executed. This configuration was same as that of the comparative example 81.

(Structural formula of NPD)

Following table shows the results of measurement of current and luminance of these devices under the application of a DC voltage of 10 V.

TABLE 18

|  | Current (mA/cm$^2$) | Luminance (cd/m$^2$) |
| --- | --- | --- |
| Example 12 | 82 | 180 |
| Comp. Ex. 81 | 3.18 | 99.4 |

Table 18 indicates that the device of the example 12 showed increases in the current and in the luminance in comparison with that of the comparative example 81, thus confirming the effect of the current enhancing material. The light emission spectrum was almost same for the example 12 and the comparative example 81, and the light emission was observed only from the Ir complex B.

In this case, since the host material TAZ is an electron transporting material, doping with a hole transporting material such as NPD is effective as the current enhancing material.

As the current enhancing material employable in the present invention, there may also be employed, for example, a hole transporting material such as m-MTDATA represented by the following structural formula, but such example is not restrictive.

(Structural formula of m-MTDATA)

In the foregoing examples, there have been explained cases employing a host material, but the present invention provides similar effects also in a case not including the host material.

In summary of the foregoing results, the luminance, efficiency and life time of the light emission were improved in comparison with a case not including the non-light emitting compound.

POSSIBILITY OF INDUSTRIAL APPLICATION

As explained in the foregoing, the present invention enables to increase the current flowing in a light emitting device, to drive such device with a lower voltage, and to improve the luminance and the light emission efficiency.

The highly efficient light emitting device of the present invention is applicable to products requiring energy saving or a high luminance. Examples of such application include a display apparatus, an illumination apparatus, a light source of a printer and a back light of a liquid crystal display. In the application to the display apparatus, there can be realized a flat panel display of a low energy consumption, high visibility and a light weight. Also in the application to the light source of a printer, the laser light source currently employed in the laser beam printer can be replaced by the light emitting device of the present invention. In such case, an image is formed by arranging independently addressable elements in an array and by giving an exposure of a desired form to a photosensitive drum. The use of the device of the present invention allows to significantly reduce the volume of the entire apparatus. Also in the illumination apparatus or in the back light, there can be expected the energy saving effect of the present invention.

What is claimed is:
1. A light-emitting device comprising:
a pair of electrodes; and
at least an organic light-emitting layer disposed between said pair of electrodes, wherein said organic light-emitting layer includes a first dopant and a second dopant different from the first dopant, said first and second dopants both being iridium organic complex compounds and each having the same skeletal structure and wherein the difference of the peak wavelengths of the light emission spectra of said first and second dopants does not exceed 30 nm.

2. A light-emitting device comprising:
a pair of electrodes; and
at least an organic light-emitting layer disposed between said pair of electrodes, wherein said organic light-emitting layer includes a first dopant and a second dopant different from the first dopant, said first and second dopants both being iridium organic complex compounds and each having the same skeletal structure and wherein the peak wavelength of the light emission spectrum of said first dopant is longer than that of said second dopant and the amount of said first dopant present in said organic light-emitting layer is greater than the amount of said second dopant.

* * * * *